United States Patent [19]
Sato

[11] Patent Number: 5,246,525
[45] Date of Patent: Sep. 21, 1993

[54] APPARATUS FOR POLISHING

[75] Inventor: Junichi Sato, Tokyo, Japan

[73] Assignee: Sony Corporation, Japan

[21] Appl. No.: 904,507

[22] Filed: Jun. 25, 1992

[30] Foreign Application Priority Data

Jul. 1, 1991 [JP] Japan ................................. 3-160682

[51] Int. Cl.$^5$ ...................... B44C 1/22; H01L 21/306; B24R 1/00
[52] U.S. Cl. .................................. 156/345; 156/636; 156/662; 51/209 R; 51/317
[58] Field of Search ................ 156/345, 636, 637, 639, 156/645, 662, 903; 51/131.1, 134.5 R, 134.5 F, 209 R, 209 DL, 317, 337 R

[56] References Cited

U.S. PATENT DOCUMENTS

| | | | |
|---|---|---|---|
| 4,021,279 | 5/1977 | Hirs | 156/654 X |
| 4,557,785 | 12/1985 | Ohkuma | 156/345 |
| 4,940,507 | 7/1990 | Harbarger | 156/636 |

Primary Examiner—William A. Powell
Attorney, Agent, or Firm—Ronald P. Kananen

[57] ABSTRACT

An apparatus for polishing a substrate is composed of a polishing plate having a pad on the surface thereof, a substrate retainer to retain the substrate being faced with exposed surface of the pad, allowing the exposed surface of the substrate to contact the surface of the pad, a slurry supply means for supplying slurry for polishing the substrate toward the surface of the pad, and a controlling means for controlling the supply amount of the slurry on the desired position of the surface of the pad. The controlling means includes a plurality of slurry supply ports concentrically located on the pad through the polishing plate. The slurry supply ports may be sparsely arranged, or alternatively, the diameter of the slurry supply ports may be gradually enlarged, according to getting close the slurry supply ports located adjacent the circumference portion of the pad from that located adjacent the center portion thereof. The controlling means may be arranged to independently supply a desired amount of the slurry from the slurry supply means to the desired positions of the pad.

5 Claims, 3 Drawing Sheets

APPARATUS FOR POLISHING

BACKGROUND OF THE INVENTION

1. Field of The Invention

The present invention relates generally to an apparatus for polishing a substrate to be flattened. Specifically, the present invention relates to an apparatus for polishing a substrate for semiconductive integrated circuits having many notches generated on the surface thereof to obtain an evenly flattened surface.

2. Description of the Background Art

Recently, multilaying a substrate for a circuit of a semiconductor, for example, a silicon semiconductor, is progressed according to microrizing and ultra high integrating of semiconductive integrated circuits. In order to multilay the circuit substrates, the surfaces of the substrates must be completely flattened. Commonly, certain kinds of flattening techniques have been known, as shown in Table 1. However, each technique has several disadvantages for flattening of the circuit substrates, which will be described as follows, though they have a measure of advantage for use.

Glass coating, using spin on glass (SOG) or such, can be easily accomplished. Throughput of glass materials is excellently smooth. However, when the circuit is microrized, cavities are generated in a groove formed thereon. On the other hand, when the circuit is thickened, cracking of the coating occurs. On the other hand, organic film coating results good surface planarity of the substrate with little cracking. However, a certain difficulty arises in processing of coating caused by moisture absorbability and toxicity of the coating material and large amount of polarization derived therefrom. Lamination of an inorganic film combined with an organic film also results good surface planarity of the substrate. However, moisture absorbability and toxicity of the coating materials also cannot be disregarded. Further, processing steps are increased compared with coating only with the organic film.

TABLE 1

| Flattening Techniques for Interlayer Insulation Film | |
|---|---|
| Coating | Glass (SOG) Coating |
| | Organic Film (PIQ) Coating |
| | Inorganic/Organic (PIQ) Laminating |
| Reflowing | Doped Oxide Reflowing |
| Etching | Etchback |
| | Contact Hole Tapered Etching |
| PVD | Bias Sputtering |
| CVD | Plasma CVD |
| | ECR CVD |

Reflowing technique is no problem in processing, however, high temperatures are required for processing and microrizing of the circuit is very difficult.

Etchback technique has excellent processibility, electrical and chemical stabilities. However, processing is very complicated and, when the circuit is microrized, cavities are generated in a groove formed thereon. Tapered etching of contact holes can also be stably accomplished. However, form controllability is insufficient. Further to say, processing steps are multiplied.

Bias sputtering results in good planarity of the circuit surface. However, the base element of the circuit tends to be damaged and multiproductivity is insufficient.

Plasma chemical vapor deposition (CVD) and ECR CVD are effective for flattening of the circuit surface because coating materials can sufficiently deposit on microrized grooves formed on the circuit. Further, ECR CVD can be accomplished at ordinary temperatures to obtain good coating with little damage. However, both CVD techniques have insufficiencies in their multiproductivity and relative specular planarity.

CVD as shown in Table 1 has been frequently utilized with etchback technique similarly shown in Table 1. An insulation film is formed by CVD technique, then the surface thereof is planary etched to obtain the plane surface. The process of CVD combined with etchback is now described in detail. A CVD film formed of $SiO_2$, or such appropriate materials, is thickly laminated on a wiring, for example, an aluminum wiring, as an interlayer insulator. A coating film for flattening, which is selected from coating materials such as a resist and a spin on glass (SOG), is applied on the CVD film and the surface of the coating film is flattened. Then, blanket etchback of the coating film and the CVD film is accomplished under the condition of 1:1 of the etch rate. However, processing for flattening is complicated to obtain the completely plane surface. Additionally, area ratio of cross section of the coating film and the insulation (CVD) film is altered according to the progressing of etchback, because the insulation film is laminated according to the configuration of the wiring, while the upper surface of the coating film is flattened. Therefore, etching rate is slightly fluctuated by the microloading effect. Regulation of etch rate of both films to 1:1 is thus difficult.

In order to simplify the flattening processing while maintaining etching rate constantly, a polishing technique has been applied to flatten the substrate surface. Polishing is the technique which has been conventionally utilized in the art of specular finishing of wafers (Si substrates), and recently, in the art of silicon on insulator (SOI) devices.

"Trench Isolation by Selective Epi and CVD Oxide Cap" J. Electrochem. SOC., Vol.137 No.12, Dec., 1990 discloses a study of flattening of an insulation film including the steps of laminating a CVD film on an aluminum wiring as an interlayer insulator to be substantially thickened, and polishing the CVD film by a polishing machine to obtain a plane surface of the film. A wafer (substrate) is put on a polishing plate having a polishing pad thereon and is rotatably supported by a shaft. Polishing agent (hereinafter, described as slurry) is supplied to the circumference of the wafer via a slurry supply port concurrently with polishing the surface of the wafer. During polishing, the wafer is pressurized toward the polishing pad by a polishing pressure control device via a wafer retainer which is rotatably supported by a wafer supporting shaft. Slurry is supplied by a slurry supply system. When polishing the wafer by the aforementioned polishing machine, the wafer surface is polished from the circumference toward the center thereof because slurry is supplied from the circumference of the wafer. Therefore, slurry supplied from the slurry supply system cannot sufficiently reach the center portion of the wafer. Thus, the polishing of the wafer circumference is progressed greater than that of the center thereof. The difference of polishing degree between the circumference and the center portion of the wafer surface increases with decreasing pressure applied to the wafer toward the polishing pad.

In order to overcome the aforementioned disadvantages, Japanese Utility Model First Publication (not allowed) No.63-754 discloses a polishing machine having a plurality of holes as slurry supply ports to uniformly supply slurry from a slurry supply system to a wafer surface. The slurry supply ports are concentrically made on a wafer polishing pad through a polishing plate. The polishing speed of the wafer surface can be control to be even at any position of the wafer surface with uniformly supply of slurry via the slurry supply ports. Japanese Patent First Publication (not allowed) No.2-100321 by the same applicant of the present invention discloses a polishing machine including a plurality of slurry supply ports as disclosed in the aforementioned Japanese Utility Model First Publication, and a wafer polishing pad formed of a porous material having successive holes therein. Slurry can be uniformly supplied from a slurry supply system to the wafer surface via the slurry supply ports and the porous polishing pad. Thus, the polishing speed of the wafer surface can be controlled to be even at any position of the wafer surface with a uniform supply of slurry. According to the aforementioned improved polishing machines, slurry is directly supplied to the wafer surface. Therefore, the wafer surface becomes plane, while that it becomes relatively convexed when slurry is supplied from the circumference of the wafer surface.

However, several problems have arose with increasing wafer diameter. Pressure applied to the wafer toward the polishing pad placed on the polishing plate becomes greater at the center portion of the wafer surface than that at the circumference thereof. When slurry is directly and uniformly supplied to the wafer surface, uniformity of polishing may not be obtained, or even, the wafer surface may be concaved.

SUMMARY OF THE INVENTION

It is therefore a principal object of the present invention to provide an apparatus for polishing a substrate to be substantially flattened the surface thereof without concerning polishing pressure applied thereto.

It is additional object of the present invention to provide an apparatus for polishing a substrate allowing the accuracy of processing the substrate to be increased.

In order to accomplish the aforementioned and other objects, an apparatus for polishing a substrate of the present invention comprises a polishing plate having a pad placed on the surface thereof, a substrate retainer to retain the substrate arranged in axial alignment with the polishing plate so as to face the exposed surface of the pad, the substrate retainer allows exposed surface of the substrate to contact the surface of the pad, a slurry supply means for supplying slurry for polishing the substrate toward the surface of the pad, and a controlling means for controlling the supply amount of the slurry on the desired position of the surface of the pad.

The controlling means includes a plurality of slurry supply ports concentrically located on the pad through the polishing plate.

The slurry supply ports may be sparsely arranged according to getting close to the slurry supply ports located adjacent the circumference portion of the pad from that located adjacent the center portion thereof. Alternatively, the diameter of the slurry supply ports may be gradually enlarged according to getting close to the slurry supply ports located adjacent the circumference portion of the pad from that located adjacent the center portion thereof.

The controlling means may be arranged to independently supply a desired amount of the slurry from the slurry supply means to the desired positions of the pad.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENT

Figure 1A:
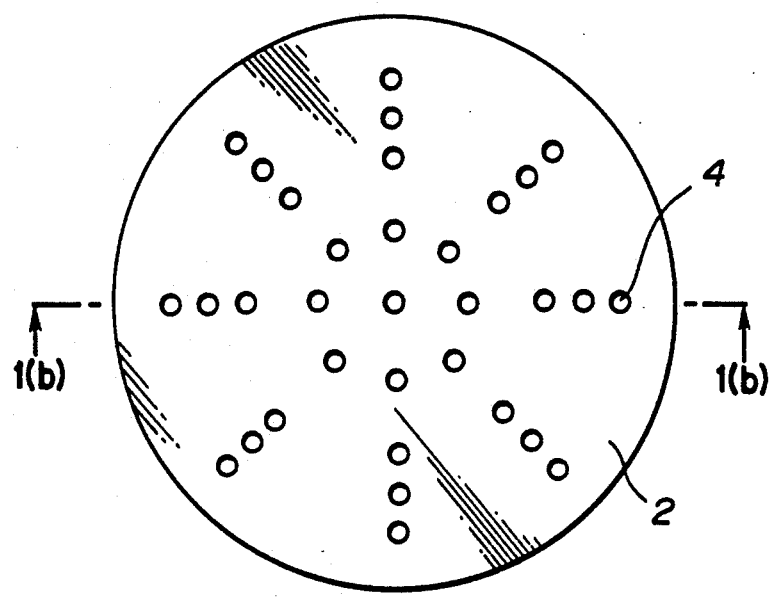
FIG. 1(a) is a schematic plane view of a polishing plate portion of a polishing machine according to the present invention.
Figure 1B:
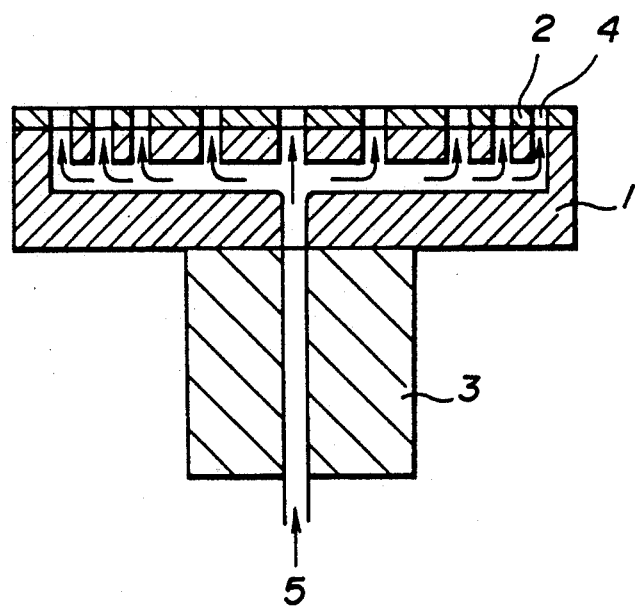
FIG 1(b) is a cross sectional view taken along lines P—P of FIG. 1(a)

Referring now to the drawings, particular to FIG. 1(a), showing a schematic plane view of a polishing plate portion to be installed in a polishing system of the present invention, and FIG. 1(b), showing a cross sectional view taken along lines P—P of FIG. 1(a), a polishing plate 1 having a polishing pad 2 placed thereon is rotatably supported by a polishing plate shaft 3. A plurality of slurry supply ports 4 are concentrically made on the polishing pad 2 so as to reach the inner portion of the polishing plate 1. The slurry supply ports 4 are connected to each other in the polishing plate 1. Slurry 5 is supplied from a slurry supply system (not shown in the figures) along the slurry supply port 4 to the surface of the polishing pad 2 via the polishing plate shaft 3, the polishing plate 1, and the polishing pad 2. The slurry supply ports 4 are sparsely arranged with getting close to the slurry supply ports 4 located adjacent the circumference portion of the polishing pad 2 from that located adjacent the center portion thereof. Therefore, the distribution of the slurry supply ports 4 is sparse adjacent the circumference of the polishing pad 2, while the distribution is dense adjacent the center thereof. Thus, amount of slurry 5 supplied to the surface of the pad can be locally controlled by the arrangement of the slurry supply ports. A wafer (not shown in the figures) is polished by pressurizing toward the polishing pad 2 by a polishing pressure control device via a wafer retainer which is rotatably supported by a wafer supporting shaft (not shown in the figures).

A $SiO_2$ film formed on a wafer by CVD is polished by the polishing machine of the present invention under the following conditions.

Rotating speed of the polishing plate 1 : 37 rpm.
Rotating speed of the wafer retainer : 17 rpm.
Polishing pressure : 8 psi.
Flow rate of slurry 225 ml/min.
Temperature of polishing pad 2 : 90° C.
The polishing rate of the $SiO_2$ film can be evened without depending on positions which is polished.

Therefore, hollowing of the wafer surface after polishing can be sufficiently prevented.

Figure 2A:
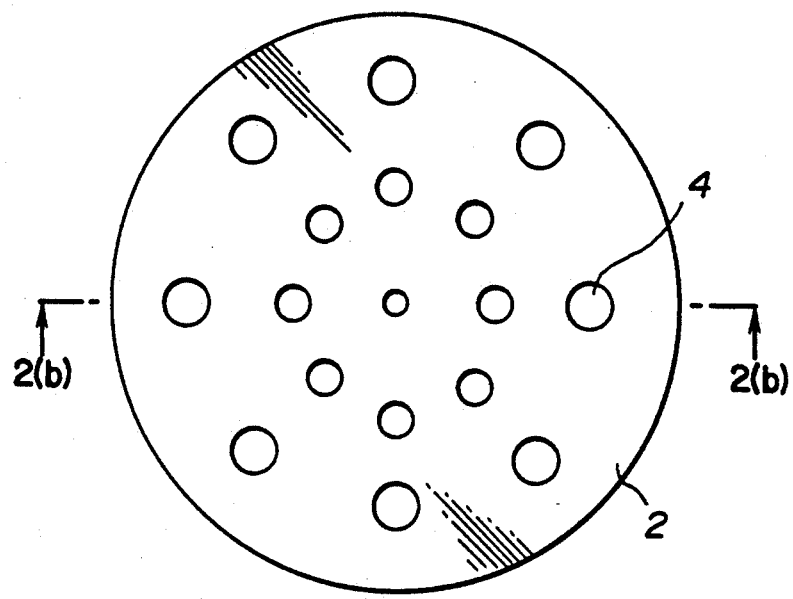
FIG. 2(a) is a schematic plane view of a polishing plate portion of a polishing machine according to the second embodiment of the present invention.
Figure 2B:
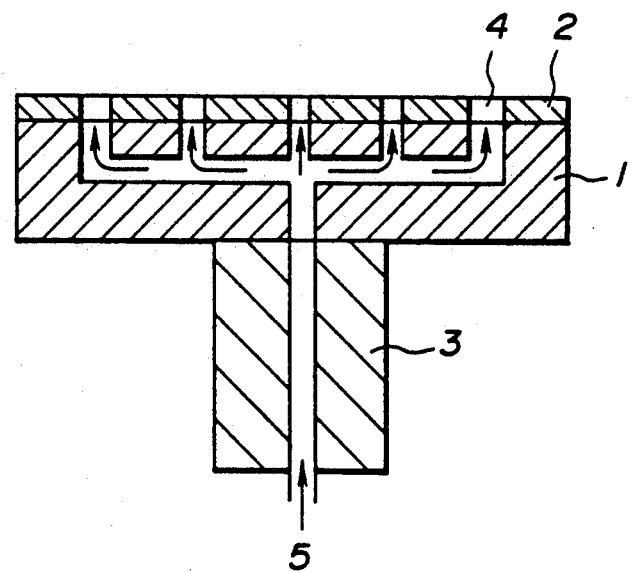
FIG. 2(b) is a cross sectional view taken along Q—Q of FIG. 2(a)

FIGS. 2(a) and (b) show a polishing plate portion of the second embodiment of the present invention. In the figures, each numeral designates the same member as the aforementioned first embodiment. Diameter of a slurry supply port 4 formed in a polishing plate 1 and a polishing pad 2 is gradually enlarged with getting close to the slurry supply ports 4 located adjacent the circumference portion of the pad 2 from that located adjacent the center portion thereof. Thus, the supply amount of slurry 5 supplied to the surface of the polishing pad 2 can be locally controlled.

A $SiO_2$ film formed on a wafer by CVD is polished by the polishing machine of the second embodiment of the present invention under the same conditions when polished by the first embodiment.

The polishing rate of the $SiO_2$ film can also be evened without depending on the positions which are polished. Therefore, hollowing of the wafer surface after polishing can be sufficiently prevented.

Figure 3A:
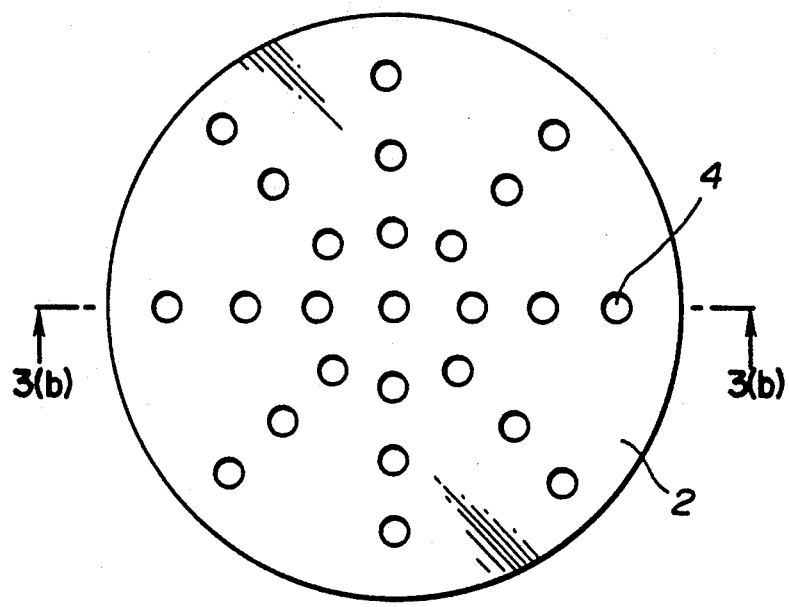
FIG. 3(a) is a schematic plane view of a polishing plate portion of a polishing machine according to the third embodiment of the present invention.
Figure 3B:
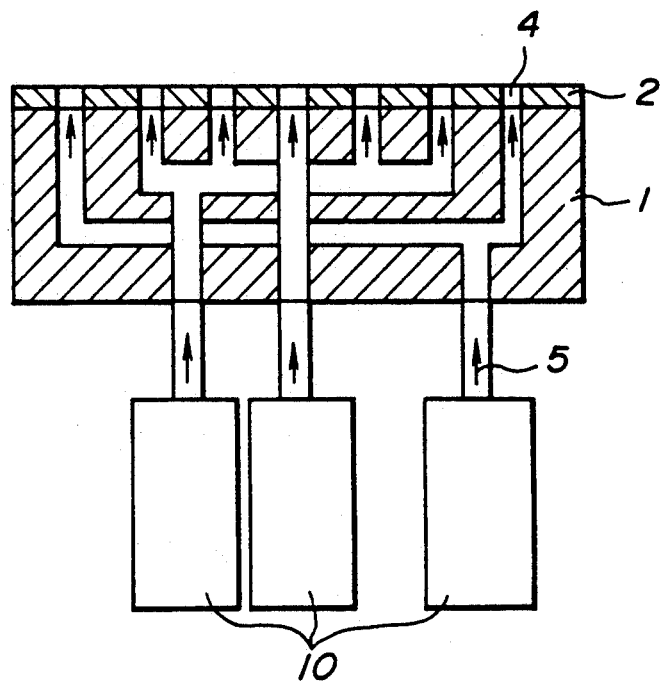
FIG. 3(b) is a cross sectional view taken along lines R—R of FIG. 3(a).

FIGS. 3(a) and (b) show a polishing plate portion of a polishing machine according to the third embodiment of the present invention. The polishing machine including same members as the aforementioned first and second embodiments, except including a slurry controlling means 10 to control the supply amount of slurry 5 supplied to the surface of a polishing pad 2 via a polishing plate 1. The slurry controlling means 10 are arranged so as to independently supply slurry 5 to a desired position of the surface of the polishing pad 2 according to polishing degree of a wafer surface. Thus, the supply amount of slurry 5 to the center portion of the wafer surface can be controlled, i.e., a smaller amount of slurry 5 for the center portion of the wafer surface is supplied than that for the circumference portion thereof.

A $SiO_2$ film formed on a wafer by CVD is polished by the polishing machine of the third embodiment of the present invention under the same conditions when polished by the first and second embodiments.

The polishing rate of the $SiO_2$ film can also be evened similar to the aforementioned embodiments without depending on positions which is polished. Therefore, hollowing of the wafer surface after polishing can be sufficiently prevented.

According to the present invention, polishing degree can be controlled by locally controlling the supply amount of slurry to the surface to be polished. That is, desired amount of slurry can be independently supplied to desired positions of the surface to be polished. Additionally, polishing pressure can be evened over whole areas of the polished surface by controlling the slurry amount. Therefore, pressure increase applied to the center portion of the polished surface can be sufficiently prevented which causes the polished surface to be hollowed. Further to say, the supply amount of slurry can also be controlled so as to prevent convexly configuring of the wafer surface. Thus, the wafer can be substantially flattened over the whole surface thereof even if wafer diameter is enlarged. Accordingly, processing of the wafer can be accomplished with high accuracy, thereof, a semiconductive integrated circuit having high quality can be obtained when utilizing it.

While the present invention has been disclosed in terms of the preferred embodiment in order to facilitate better understanding of the invention, it should be appreciated that the invention can be embodied in various ways without depending from the principle of the invention. Therefore, the invention should be understood to include all possible embodiments and modification to the shown embodiments which can be embodied without departing from the principle of the inventions as set forth in the appended claims.

What is claimed is:

1. An apparatus for polishing a substrate comprising:
    a polishing plate having a pad placed on the surface thereof,
    a substrate retainer to retain said substrate arranged in axial alignment with said polishing plate so as to face an exposed surface of said pad, said substrate retainer allowing an exposed surface of said substrate to be in contact with the surface of said pad,
    a slurry supply means for supplying slurry for polishing said substrate toward the surface of said pad, and
    a controlling means for controlling the supply amount of said slurry on the desired position of the surface of said pad.

2. An apparatus as set forth in claim 1, wherein said controlling means includes a plurality of slurry supply ports concentrically located on said pad through said polishing plate.

3. An apparatus as set forth in claim 2, wherein said slurry supply ports are located further apart adjacent the circumference portion of said pad and closer together adjacent the center portion thereof.

4. An apparatus as set forth in claim 2, wherein the diameter of said slurry supply ports are gradually enlarged adjacent the circumference portion of said pad compared to those located adjacent the center portion thereof.

5. An apparatus as set forth in claim 2, wherein said controlling means is arranged to independently supply a desired amount of said slurry from said slurry supply means to the desired positions of said pad.

* * * * *